United States Patent [19]
Englund et al.

[11] Patent Number: 5,936,502
[45] Date of Patent: Aug. 10, 1999

[54] MAGNET COILS FOR MRI

[75] Inventors: Rurik B. Englund, Porvoo; Ilmari V. Kinanen, Espoo; Jan-Erik M. Lindholm, Vasterskog, all of Finland

[73] Assignee: Picker Nordstar Inc., Finland

[21] Appl. No.: 08/985,935

[22] Filed: Dec. 5, 1997

[51] Int. Cl.$^6$ .................................................. H01F 5/00
[52] U.S. Cl. ............................................. 335/299; 335/300
[58] Field of Search ...................................... 335/216, 296, 335/297, 298, 299–300; 324/318, 319, 320

[56] References Cited

U.S. PATENT DOCUMENTS

| | | | |
|---|---|---|---|
| 4,667,174 | 5/1987 | MacKinnon et al. | 324/318 |
| 5,173,678 | 12/1992 | Bellows et al. | 335/216 |
| 5,554,929 | 9/1996 | Doty et al. | 324/318 |

*Primary Examiner*—Lincoln Donovan
*Attorney, Agent, or Firm*—Timothy B. Gurin; John J. Fry

[57] ABSTRACT

An MR imaging apparatus includes a magnet assembly having two generally opposed pole pieces. Current flowing in driver coils associated with each pole pieces generates a magnetic field in the imaging region. The driver coils include a conductor having beveled edges, the conductor being wound in a spiral fashion. A layer of electrical insulation is located between the conductor windings. A cooling member fabricated from bifilar wound tubing having a generally rectangular cross section is in thermal communication with each driver coil. Coolant flowing through the cooling member removes heat generated in the driver coils.

22 Claims, 5 Drawing Sheets

MAGNET COILS FOR MRI

BACKGROUND

The present invention relates to magnet systems, and more particularly to driver coils and cooling techniques for use in resistive electromagnets. The present invention finds particular application in the field of magnetic resonance imaging (MRI).

MRI is widely used for imaging anatomical and other structures. A commonly used type of magnet for MRI systems is the superconducting type, which is capable of generating field strengths in the range of 0.5–2 Tesla (T). Superconducting magnets are, however, relatively expensive to manufacture and operate.

At lower fields, for example in the range of 0.1 to 0.3 T, resistive magnets are commonly used to produce magnetic fields for MRI applications. Resistive magnets typically include one more magnet driver coils operating in cooperation with a suitable magnet structure, the magnetic field strength being generally proportional to the current through the coils. A limitation on magnet performance, however, is the heat generated in the resistance of the driver coils. As a result, cooling systems have been used to remove this excess heat.

To provide the necessary cooling, annular cooling flanges or discs fabricated from a material such as aluminum have been placed in thermal contact with the magnet coils. Channels having a size and depth sufficient to accommodate and retain copper tubing having a round cross section have been included on one side of the cooling flange, which has had a thickness greater than that of the tubing. The channels and tubing are arranged in a bifilar wound pattern so that the inlet and outlet of the tubing are both accessible from the outer radius of the cooling flange. The cooling flanges have then been placed against the driver coils, with the tubing preferably on the side of the flange facing away from the magnet coil. In operation, a coolant such as water has been caused to flow through the tubing.

In practice, however, neither the surface of the driver coil nor surface of the cooling flange are perfectly flat. The resultant gaps degrade the thermal conductivity between the coil and flange. There have also been radial gaps between the channels and hence the turns of tubing, also reducing thermal efficiency.

In magnet systems having two driver coils on each pole of the magnet it has been necessary to use three cooling flanges. The structure associated with each pole has thus included a first cooling flange, a driver coil having its first side electrically insulated from but in thermal contact with the first cooling flange, a second cooling flange located between the second side of the first driver coil and first side of a second driver coil (the second cooling flange being in thermal contact with but electrically insulated from the driver coils), the second driver coil, and a third cooling flange electrically insulated from but in thermal contact with the second side of the second driver coil.

Driver coils have also included many turns of a conductor such as aluminum arranged in a generally planar, disc-shaped coil. The conductor has had a rectangular cross-section, with the conductor wound or coiled from an inner to an outer radius in the form of an annulus or disc. To insulate between the multiple conductor turns, an anodized aluminum conductor has been used. A disadvantage of anodized aluminum, however, is its cost. A further disadvantage is that defects in the anodization may result in short circuits between coil turns, with a corresponding deleterious effect on magnet performance.

While prior art magnet coils have proven satisfactory, there remains room for improvement. To improve magnet performance, it is also desirable to improve the efficiency of the cooling system, not only to reduce the absolute temperature of the magnet coils, but also to minimize temperature gradients within the coils themselves. It is also desirable to reduce the cost and complexity of the cooling system. In addition, a technique for insulating the turns of the magnet coil which avoids the disadvantages of the anodized approach but which does not degrade the performance of the cooling system is needed.

SUMMARY

The present invention addresses these issues, and others.

In accordance with a first aspect of the invention, a magnet coil assembly includes a generally planar driver coil. Current flowing through the driver coil causes heat to be generated. The assembly also includes tubing which contains the flow a of coolant. The tubing has a substantially planar exterior portion which faces and is in thermal communication with the surface of the driver coil.

According to a more limited aspect of the invention, the tubing has a rectangular exterior cross section.

According to another more limited aspect of the invention, the tubing is wound to define a plurality of generally planar turns. A layer of thermally insulating material having a thickness less than that of the tubing may be located between the turns.

According to yet another more limited aspect of the invention, the tubing is bifilar wound.

According to another more limited aspect, the driver coil and the and the tubing are separated by a layer of electrical insulation which defines a plurality of holes. According to a still more limited aspect, an epoxy is located between the insulation and the driver coil.

According to another aspect of the invention, a magnet for use in MRI includes two pole pieces in an opposed relationship which define an imaging region. A driver coil and a material for defining a cooling passage are associated with the first pole piece. The material has a substantially planar portion facing and in thermal communication with the driver coil. A driver coil and material for defining a cooling passage are also associated with the second pole piece. The material has a substantially planar portion facing and in thermal communication with the driver coil associated with the second pole piece.

According to a more limited aspect of the invention, the driver coil associated with the first pole piece includes a conductor which has a generally rectangular cross section. An edge of the conductor which is adjacent to the material is beveled. According to a still more limited aspect, the conductor is wound to define a plurality of generally planar turns. The turns are separated by a layer of electrical insulation. According to a still more limited aspect, the electrical insulation does not extend past the edge of the conductor facing the material in thermal communication therewith.

According to another aspect of the invention, a magnet coil assembly for use in magnetic resonance imaging includes a first driver coil and material which defines a cooling passage. The material has a substantially planar portion which faces and is in thermal communication with the first surface of the first driver coil. A second surface of the second driver coil is adjacent the second surface of the first driver coil. Material which defines a cooling passage and has a substantially planar portion faces and is in thermal communication with the first surface of the first driver coil.

A first advantage of the present invention is that improved thermal performance in a magnet system is provided while minimizing cost and complexity.

Another advantage of the present invention is that improved thermal communication between the cooling member and the driver coil is provided.

Yet another advantage is that a separate cooling flange may be eliminated.

Still other advantages will be recognized by those skilled in the art after reading and understanding the appended description.

DRAWINGS

DESCRIPTION

Figure 1:
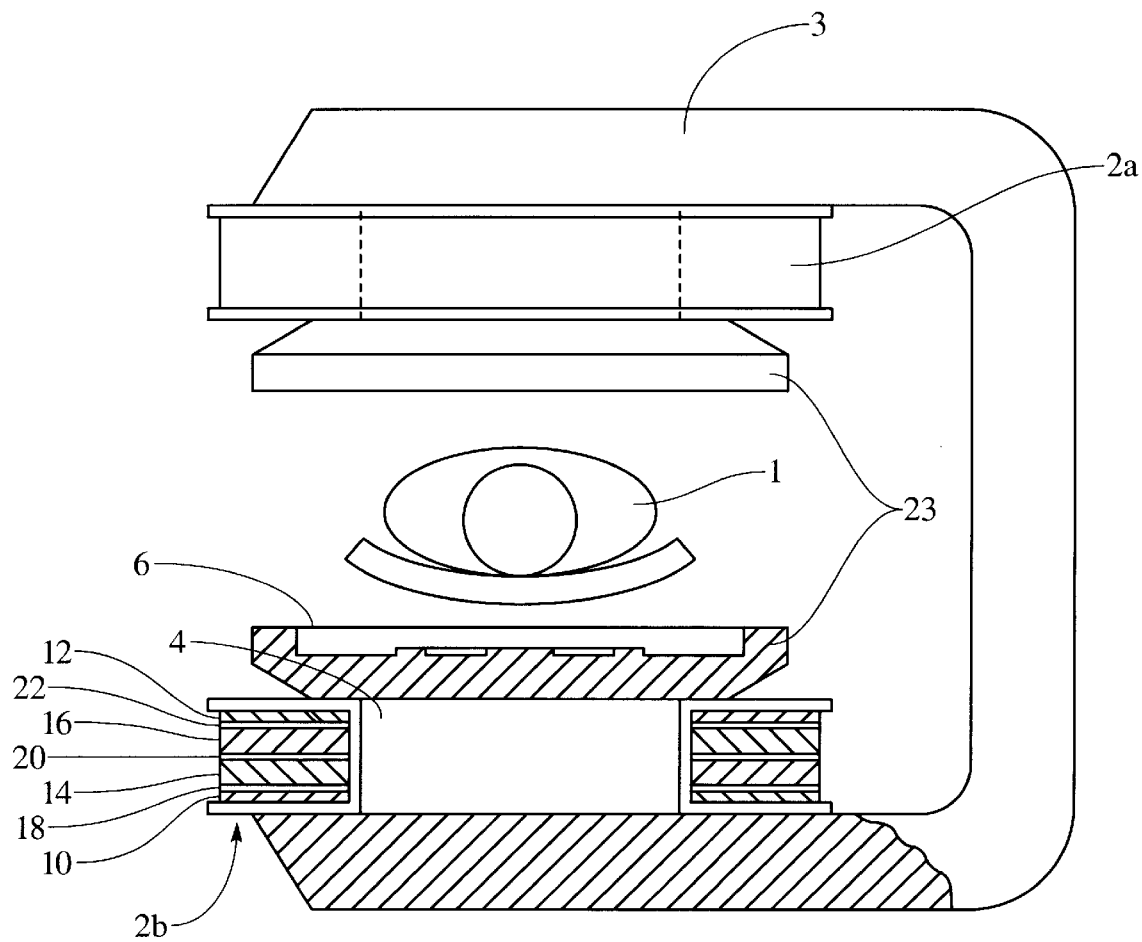
FIG. 1 depicts an MRI apparatus according to the present invention.

With reference to FIG. 1, an MRI apparatus which produces images of the anatomy of patient 1 includes a generally c-shaped magnet body 3. The patient 1 is placed in an imaging region located between the pole pieces 23. Current flowing in the driver coils contained in coil assemblies 2a, 2b generates a magnetic field Bo in the imaging region. Necks 4 connect the pole pieces 23 to the body 3 of the magnet, thereby providing a return path for the body of the magnet.

Gradient coils 6 generate time-varying gradient magnetic fields, preferably in three orthogonal directions (e.g., x, y, z). As known in the art, the MRI apparatus also includes RF transmit and receive coils (not shown) for exciting magnetic resonance of materials within the imaging region and detecting signals excited thereby. As is also conventional in the art, associated signal processing and computer apparatus generates and displays images of the internal anatomy of the patient on a CRT or other suitable monitor.

Figure 2:
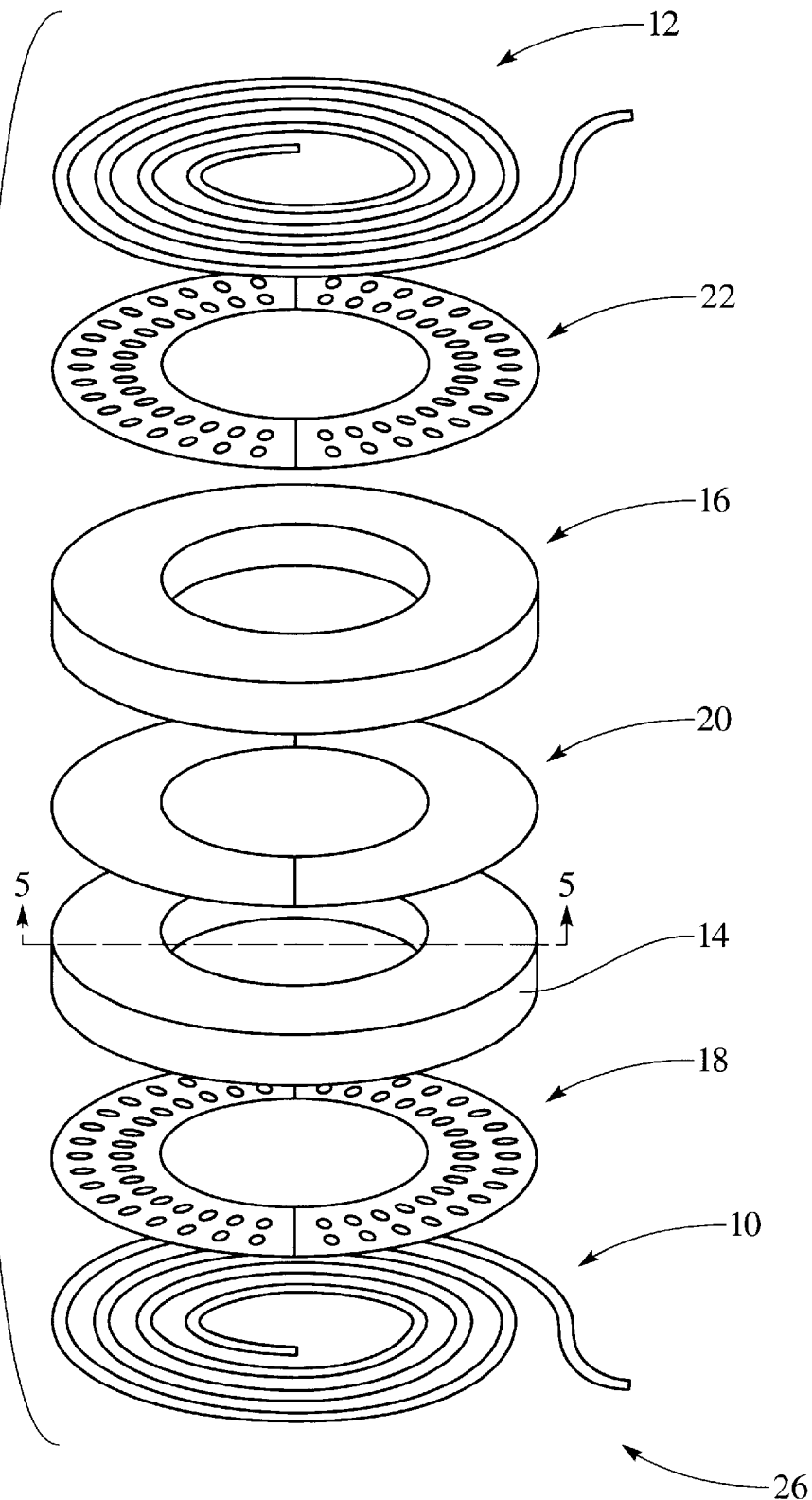
FIG. 2 is an exploded view of a magnet coil assembly.

FIG. 2 depicts the various components of the lower magnet coil assembly 2b, it being understood that lower magnet coil assembly 2b is also representative of the upper magnet coil assembly 2a.

Figure 3:
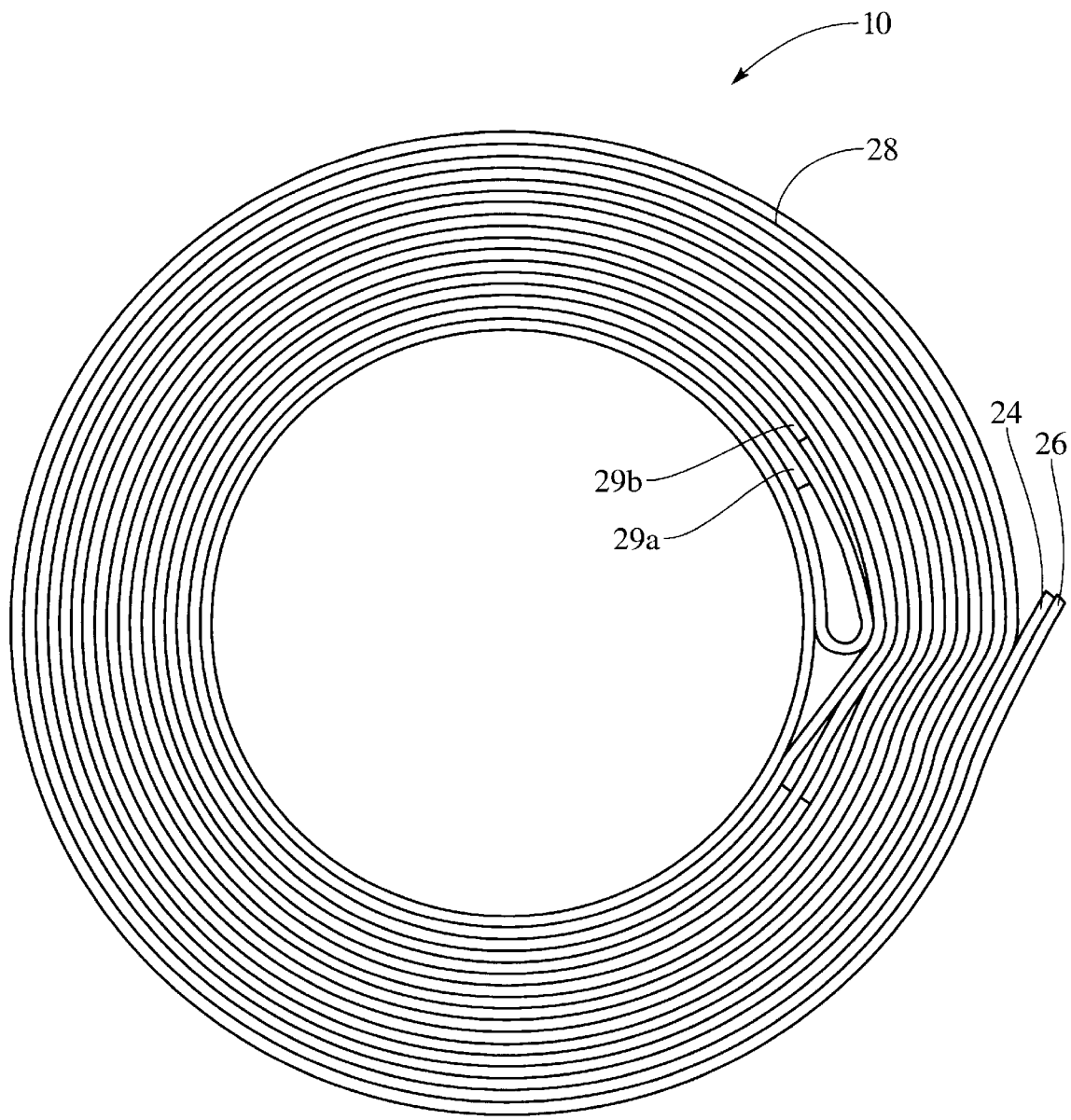
FIG. 3 is a top view of a cooling member.

With reference to FIG. 1, 2, and 3, the magnet coil assembly 2b includes a pair of cooling members 10, 12, a pair of magnet coils 14, 16, and electrical insulation layers 18, 20, 22. Each cooling member 10 is fabricated from tubing wound in a generally planar annular configuration. The tubing is preferably copper tubing having an 8×12 mm rectangular exterior cross section and is bifilar wound, with the 12 mm dimension of the tube running in the radial direction. Other materials and cross sections may also be used, provided that tubing is wound so that a substantially flat portion of the tubing cross section may be placed facing and in thermal contact with the magnet coil 14. Placed between each of the adjacent layers of tubing is thermal insulation such as PVC having a thickness of approximately 2 mm. Typical conductivity for a polymer such as PVC is approximately 0.3 w/mK. The tubing is wound so that adjacent turns of tubing are substantially adjacent, though separated by thermal insulation 28. The member has in inlet 24 through which a coolant such as water is introduced, and an outlet 26 from which the coolant exits after having flowed through the tubing. Mechanical spacers 29a, 29b are placed in the inner layers of the winding to account for spaces caused by the bend of the bifilar wound tubing and thus maintain the circularity of the cooling member 10.

Figure 4:
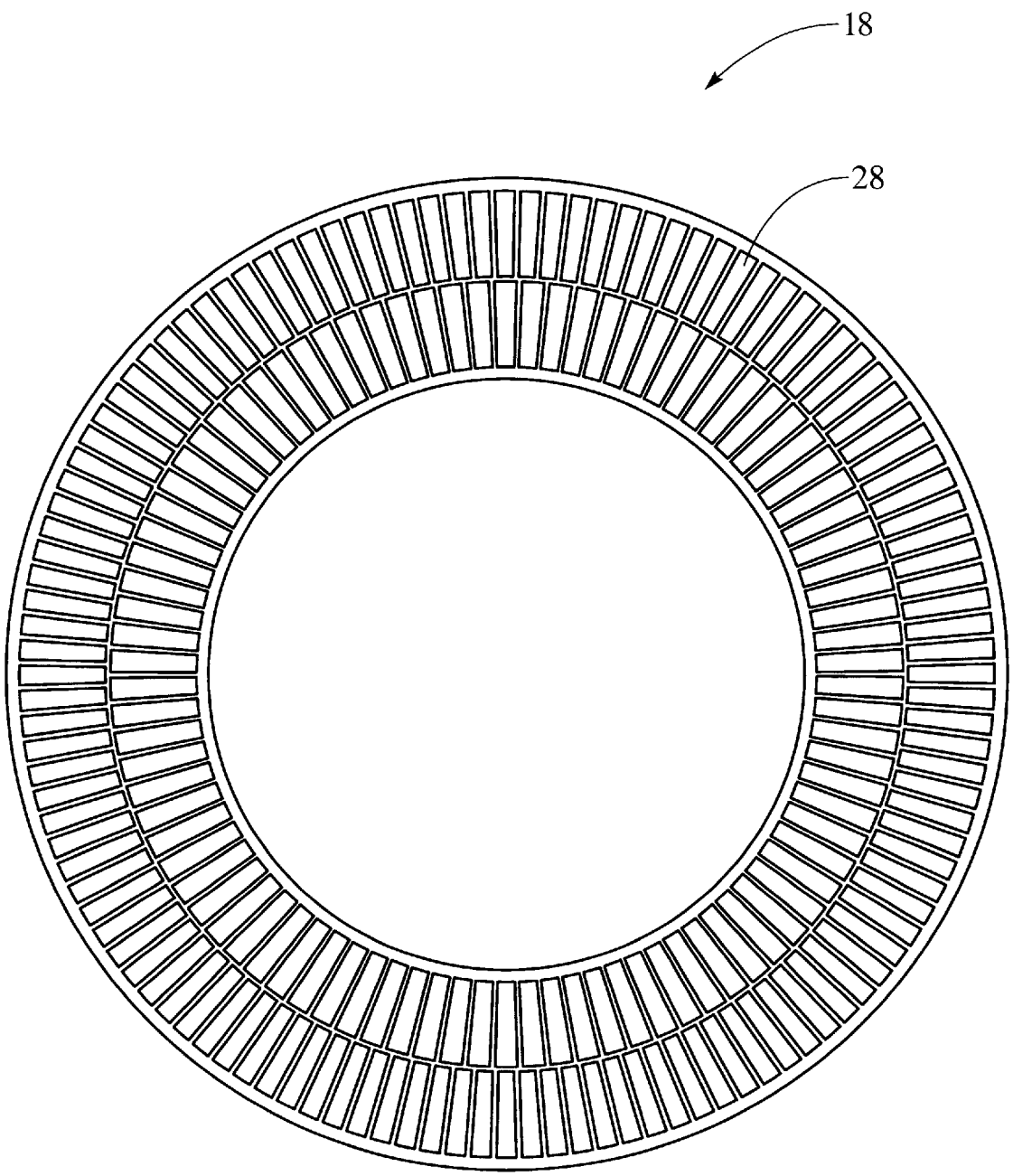
FIG. 4 is a top view of a perforated insulating layer.

An electrical insulation layer 18 is located between the cooling member 10 and the driver coil 14. The insulation layer 18 should provide a desired degree of electrical isolation consistent with good thermal communication between the cooling spiral 10 and the driver coil 14. With reference to FIG. 4, the insulation layer 18 is of an annular shape and contains a plurality of perforations or holes 28. A uniform layer of epoxy adhesive is used to fasten the cooling member 10 to the driver coil 14. The epoxy preferably provides a high degree of thermal conductivity, which in practice means a high filler content, and a desired degree of electrical isolation. Because the insulation layer 18 contains numerous perforations 28, the epoxy layer joins the cooling member 10 and the driver coil 14 over a substantial portion of their surface. The epoxy preferably has a minimum of voids so as to maximize thermal communication between the cooling member 10 and the driver coil 14. To improve electrical isolation, the cooling member 10 may also be coated with a layer of lacquer.

Figure 5:
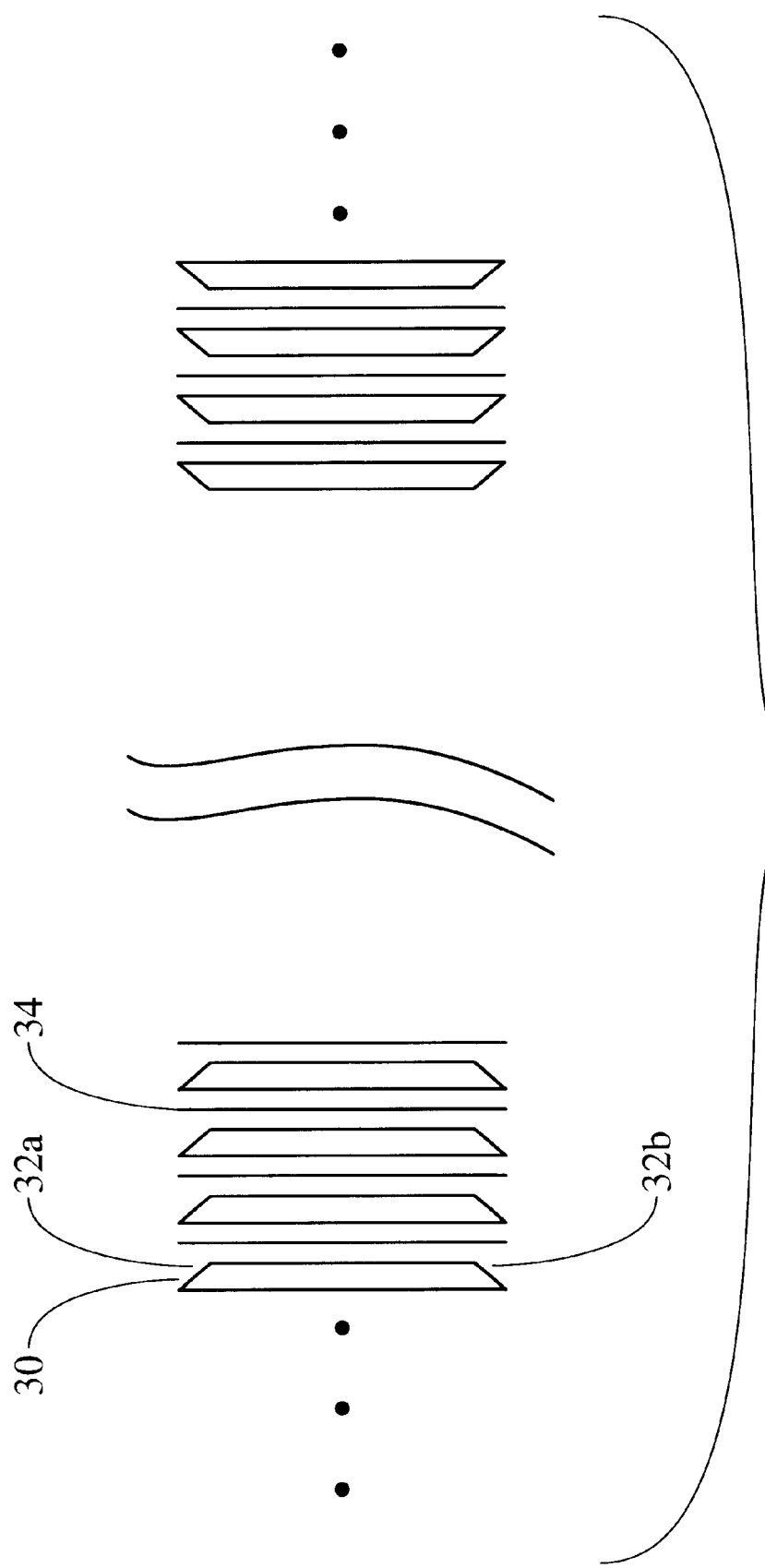
FIG. 5 is a sectional view of a portion of the windings of a driver coil along line 5—5 of FIG. 2.

With reference to FIGS. 2 and 5, a generally planar driver coil 14 contains a plurality of turns of a spiral-wound electrical conductor 30 such as aluminum. An electrical connection is made at one end of the conductor 30 at the inside of the spiral and at the other end at the outside of the spiral. A cross section of a portion of the driver coil 14 showing a representative portion of the coil windings is shown in FIG. 5. While gaps are shown between the windings for ease of illustration, it will be appreciated that in practice the winding are substantially adjacent.

The conductor 30 is characterized by a generally rectangular cross section having beveled edges 32a and 32b. An electrical insulation layer 34 such as Mylar is placed between the turns of the conductor 30, thus preventing the turns from making electrical contact. The beveled surfaces prevent electrical contact near the upper and lower edges of the conductor 30 in the event that the vertical dimensions of the insulating layer 34 or conductor 30 should vary or if the insulating layer 34 is not precisely positioned. In practice, the nominal dimensions of the bevels 32a, 32b and the height of the insulating layer 32 are chosen so that electrical insulation between the conductor 30 turns is achieved despite variations in the material and assembly techniques while preventing or minimizing protrusion of the insulating layer 32 beyond the vertical extent or edges of the conductor 30. This in turn facilitates thermal communication between the conductor and adjacent layers or structures such as the cooling member 10. In an arrangement where the conductor has a nominal height of 100 mm and a nominal thickness of 0.5 mm, satisfactory results have been achieved with bevels 32a, 32b having a height of 1 mm and a depth of 0.02 mm and an insulation layer 34 having a height of 100 mm.

An electrical insulation layer 20 is placed between the driver coils 14, 16. The insulation layer 18 is selected to provide a desired degree of electrical isolation between the driver coils 14, 16. The coils 14, 16 are bonded to the insulation layer using an epoxy. Of course, other arrangements, such as those described above in regard to insulation layer 18, may be used if improved thermal communication between driver coils 14, 16 is desired.

While the foregoing description has been directed primarily to cooling member 10, insulating layer 18, and driver coil 14, it will be appreciated that it applies equally to driver coil 16, insulating layer 22, and cooling member 22. After assembly, the entire structure is hermetically sealed using epoxy, a glass fiber laminate, or like technique.

In operation, a current source provides an electrical current to the magnet assemblies 2a, 2b so that a desired magnetic field Bo is generated, and coolant such as water is caused to flow through passages defined by the material of the cooling members 10, 12. Being relatively flexible, the cooling members may be placed in good thermal contact with the driver coils 12, 14 during the manufacturing process, for example by applying pressure during assembly. Thus, the system is relatively tolerant of variations in the surfaces of the cooling member and driver coils. Because protrusions of the relatively thermally insulating Mylar beyond the surface of the driver coils are minimized, thermal communication between the cooling members and the driver coils 12, 14 is further enhanced.

Although the cooling member has been described in terms of bifilar wound tubing, other configurations are possible. Thus, for example, coolant may be introduced to the cooling members through headers or manifolds, each feeding a plurality of cooling passages. In one embodiment, each cooling member includes a first inlet manifold and first exit manifold which are associated with a first plurality of cooling passages, and a second inlet manifold and second exit manifold which are associated with a second plurality of passages. The first and second passages are interleaved, with the direction of coolant flow in opposite directions.

As will be appreciated, coolant entering the inlet side 24 of the cooling member is cooler than that exiting through the outlet 26. A particular advantage of the bifilar winding of the cooling member is that variation in temperature of the cooling member in the radial direction are minimized. This in turn minimizes variation in temperature of the driver coils 12, 14 in the radial direction. Effective thermal insulation between the individual turns in the cooling member also improves the thermal efficiency of the cooling member.

The invention has been described in relation to a c-shaped magnet apparatus. It will be appreciated that the invention can be used with other magnet configurations, such as the so-called four-poster type, the so-called H-form, or other configurations which provide a return path for the magnet flux.

The invention has been described with reference to the preferred embodiment. Obviously, modifications and alterations will occur to others upon reading an understanding the preceding description. It is intended that the invention be construed as including all such modifications an alterations insofar as they come within the scope of the appended claims or the equivalents thereof.

We claim:

1. A magnet coil assembly comprising:
    a generally planar driver coil having at least a first surface, heat being generated in the driver coil in response to the flow of electrical current;
    tubing for containing the flow of a coolant which removes heat generated in the magnet coil, the tubing having an exterior cross section which includes a flat cross section portion, the flat portion facing and in thermal communication with the first surface of the driver coil.

2. The coil assembly of claim 1 wherein the tubing has a rectangular exterior cross section.

3. The coil assembly of claim 1 wherein the tubing is wound to define a plurality of generally planar turns.

4. The coil assembly of claim 3 comprising a layer of thermally insulating material between the turns.

5. The coil of claim 4 wherein the thermally insulating material has a thickness less than that of the tubing.

6. The coil assembly of claim 1 wherein the tubing is bifilar wound.

7. The coil assembly of claim 1 wherein the driver coil and the tubing are separated by a layer of electrical insulation, the layer of electrical insulation having a plurality of holes.

8. The coil assembly of claim 7 comprising an adhesive between the material and the driver coil.

9. The coil assembly of claim 8 wherein the adhesive is an epoxy having a high thermal conductivity.

10. The coil assembly of claim 1 wherein the coolant comprises water.

11. A magnet apparatus for use in magnetic resonance imaging comprising:
    two pole pieces in an opposed relationship and defining an imaging region therebetween;
    a driver coil associated with the first pole piece, heat being generated in the driver coil in response to the flow of current;
    material defining a passage for containing the flow of a coolant therethrough, the material having an exterior cross section which includes a flat cross section portion, the flat portion facing and in thermal communication with the driver coil associated with the first pole piece;
    a driver coil associated with the second pole piece, heat being generated in the driver coil in response to the flow or current therethrough; and
    material defining a passage for containing the flow of a coolant therethrough, the material having an exterior cross section which includes a flat cross section portion, the flat portion facing and in thermal communication with the driver coil associated with the second pole piece.

12. The magnet apparatus of claim 11 wherein the material has a generally rectangular exterior cross section.

13. The magnet apparatus of claim 12 wherein the material comprises tubing.

14. The magnet apparatus of claim 11 wherein the material is wound so as to define a plurality of generally planar turns.

15. The magnet apparatus of claim 14 comprising a layer of thermally insulating material located between the turns.

16. The magnet apparatus of claim 11 wherein the driver coil associated with the first pole piece comprises a conductor having a generally rectangular cross section, an edge of the conductor adjacent the material having a bevel.

17. The magnet apparatus of claim 16 wherein the conductor is wound so as to define a plurality of generally planar turns and the turns are separated by a layer of electrical insulation.

18. The magnet apparatus of claim 17 wherein the electrical insulation does not extend past the edge of the conductor facing the material in thermal communication therewith.

19. A magnet coil assembly for use in magnetic resonance imaging comprising:
    a first driver coil having first surface and second surfaces, heat being generated in the magnet coil in response to the flow of electrical current therethrough;
    material defining a passage for containing the flow of a coolant therethrough, the material having an exterior cross section which includes a flat cross section portion, the flat portion facing and in thermal communication with the first surface of the first driver coil;

a second driver coil having first and second surfaces, the second surface of the second driver coil adjacent the second surface of the first driver coil; and material defining a passage for containing the flow of a coolant therethrough, the material having an exterior cross section which includes a flat cross section portion, the flat portion facing and in thermal communication with the first surface of the second driver coil.

20. The magnet coil assembly of claim 19 wherein the material comprises tubing having a generally rectangular exterior cross section.

21. The magnet coil assembly of claim 19 wherein the material facing and in thermal communication with the first surface of the first driver coil defines a plurality of passages.

22. The magnet coil assembly of claim 19 wherein the first driver coil comprises a conductor having a generally rectangular cross section, an edge of the conductor adjacent the material having a bevel, an edge of the conductor opposite the material having a bevel.

* * * * *